United States Patent [19]
Barrow

[11] Patent Number: 5,949,651
[45] Date of Patent: *Sep. 7, 1999

[54] QUAD FLAT PACK INTEGRATED CIRCUIT PACKAGE

[75] Inventor: Michael Barrow, El Dorado Hills, Calif.

[73] Assignee: Intel Corporation, Santa Clara, Calif.

[ * ] Notice: This patent is subject to a terminal disclaimer.

[21] Appl. No.: 09/179,016

[22] Filed: Oct. 26, 1998

Related U.S. Application Data

[63] Continuation of application No. 08/984,766, Dec. 4, 1997.

[51] Int. Cl.⁶ .................................................. H05K 01/18

[52] U.S. Cl. ......................... 361/723; 361/707; 361/717; 361/718; 361/722; 174/163; 257/676; 257/666; 257/775

[58] Field of Search .................................... 361/723, 704, 361/707, 717, 718, 722; 165/80.2, 80.3; 257/676, 666, 775; 174/16.3

[56] References Cited

U.S. PATENT DOCUMENTS

| | | | |
|---|---|---|---|
| 5,279,029 | 1/1994 | Burns | 29/856 |
| 5,397,746 | 3/1995 | Blish, II | 29/827 |
| 5,489,801 | 2/1996 | Blish, II | 257/675 |
| 5,530,284 | 6/1996 | Bailey | 257/670 |
| 5,646,831 | 7/1997 | Manteghi | 361/813 |

*Primary Examiner*—Leo P. Picard
*Assistant Examiner*—David Foster
*Attorney, Agent, or Firm*—Blakely, Sokoloff, Taylor & Zafman

[57] ABSTRACT

A quad flat pack (QFP) integrated circuit package that is modified to include a tab that increases the thermal efficiency of the package. The package contains an integrated circuit that is mounted to a die paddle of a lead frame. A plurality of leads extend from a first side of the die paddle. Placing all of the leads on one side of the package minimizes the difference in signal length between the leads. The tab extends from a second side of the die paddle. Both the leads and the tab extend from a plastic housing which encapsulates the integrated circuit. The tab provides a large conductive area which increases the heat transfer rate from the integrated circuit to the ambient, or an external thermal element.

6 Claims, 4 Drawing Sheets

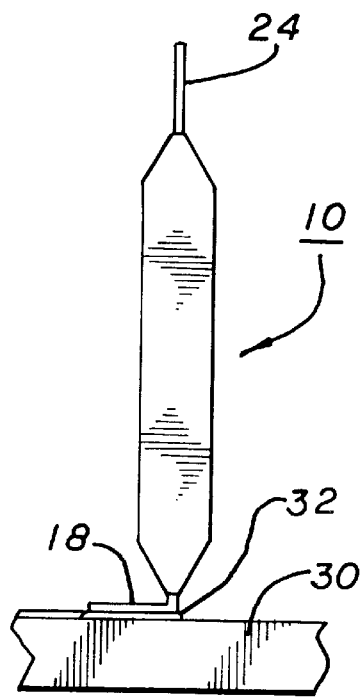
FIG. 3
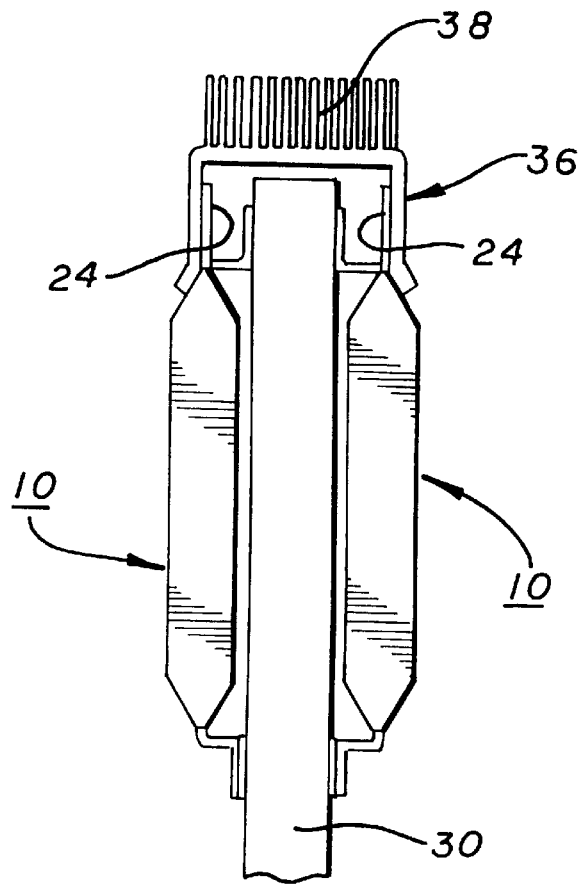
FIG. 5
FIG. 4
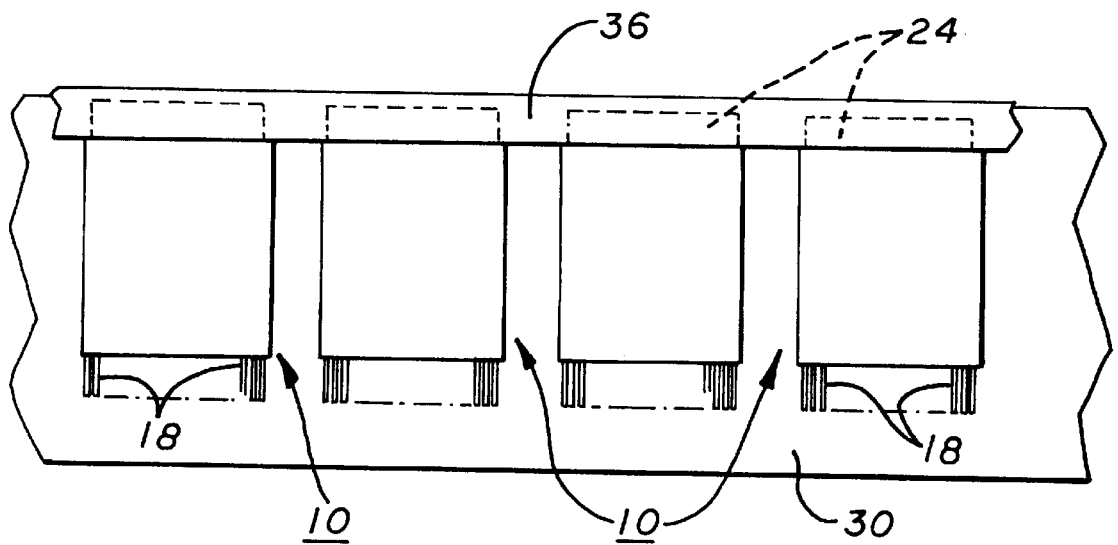

QUAD FLAT PACK INTEGRATED CIRCUIT PACKAGE

CROSS-REFERENCE TO RELATED APPLICATIONS

This application is a continuation application of application Ser. No. 08/984,766, filed Dec. 4, 1997.

BACKGROUND OF THE INVENTION

1. Field of the Invention

The present invention relates to an integrated circuit package.

2. Background Information

Integrated circuits are typically assembled to a package that is mounted to a printed circuit board. There have been developed many types of integrated circuit packages including quad flat pack (QFP), ceramic pin grid array (PGA) and ball grid array (BGA) packages.

QFP packages contain a metal lead frame that has a plurality of individual leads which extend from a center die paddle. The die paddle supports the integrated circuit. The integrated circuit has a number of bond pads that are wire bonded to the individual leads. The integrated circuit and a portion of the lead frame are encapsulated with an injection molded plastic housing. QFP packages are relatively simple to assemble and inexpensive to produce. Unfortunately, QFP packages have a relatively high lead to lead spacing so that the density of the package pins is relatively low. It is generally desirable to have a high pin density to provide a large number of signal lines in a small amount of space. Additionally, the outer plastic housing of a QFP package has a low coefficient of thermal conductivity. QFP packages therefore do not efficiently remove heat generated by the integrated circuits. Consequently, QFP packages typically house relatively low power devices.

PGA packages include a plurality of pins that extend from a housing which encloses an integrated circuit. The pins of the package are mounted to an external printed circuit board. PGA package housings are typically constructed from a ceramic material, or a plastic/printed circuit board process, which create relatively high pin densities.

PGA packages typically include heat slugs and heat sinks that efficiently remove heat from the integrated circuit. Consequently, high powered integrated circuits such as microprocessors are typically packaged within PGA packages. Unfortunately, PGA packages are more expensive to produce than QFP products.

BGA packages have a plurality of solder balls that are attached to a substrate. The substrate may be constructed from ceramic or printed circuit board processes. Like PGA packages, BGA's provide high pin densities and may include a thermal element to remove heat generated by the integrated circuit. Unfortunately, BGA packages are also relatively expensive to produce.

There is always a desire to increase the memory and I/O busses of a system. The memory bus runs from a package that contains a microprocessor to a package(s) that contains a memory device(s). The packages are typically coupled together by a motherboard. Present packages typically provide leads, pins or solder balls in two dimensional arrays. The two dimensional arrays create variations in signal lengths between packages. It is desirable to provide equal signal paths for each data signal to minimize the slew between signals. Excessive signal slew may create data corruption, particularly for high speed busses. It would be desirable to provide an integrated circuit package which is thermally efficient, inexpensive to produce, and minimizes the difference in signal lengths between signal lines.

SUMMARY OF THE INVENTION

An integrated circuit package that includes an integrated circuit which is mounted to a die paddle area of a lead frame. The lead frame includes at least two leads extending from a first side of the die paddle area and a tab that extends from a second side of the die paddle area. The package includes a housing that surrounds the integrated circuit.

BRIEF DESCRIPTION OF THE DRAWINGS

FIG. 3 is a side view showing a package mounted to a printed circuit board;

FIG. 4 is a side view of an electrical assembly;

FIG. 5 is an end view of an electrical assembly;

DETAILED DESCRIPTION OF THE INVENTION

As one embodiment, the present invention is a quad flat pack (QFP) integrated circuit package that is modified to include a tab that increases the thermal efficiency of the package. The package contains an integrated circuit that is mounted to a die paddle of a lead frame. A plurality of leads extend from a first side of the die paddle. Placing all of the leads on one side of the package minimizes the difference in signal length between the leads. The tab extends from a second side of the die paddle. Both the leads and the tab extend from a plastic housing which encapsulates the integrated circuit. The tab provides a large conductive area which increases the heat transfer rate from the integrated circuit to the ambient, or an external thermal element. The present invention thus provides a relatively inexpensive QFP package that can remove heat more efficiently than QFP packages of the prior art.

Figure 1:
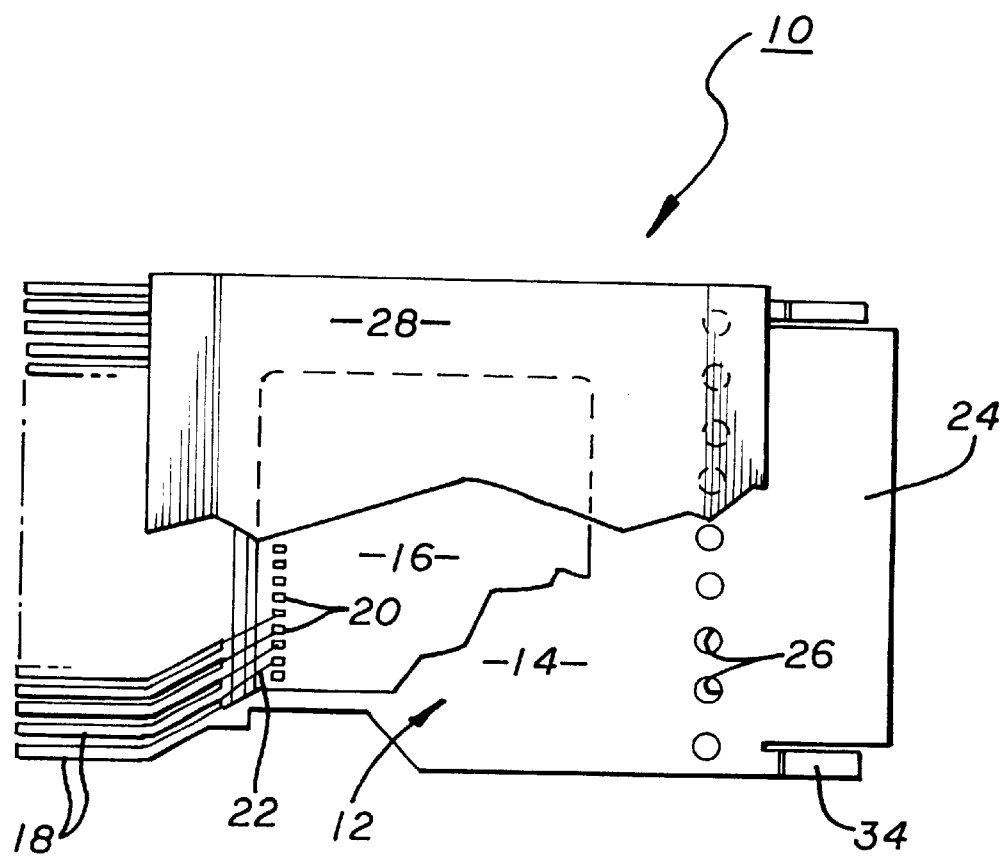
FIG. 1 is a top cross-sectional view of an integrated circuit package of the present invention.

FIG. 1 shows one embodiment of an integrated circuit package 10 of the present invention. The package 10 includes a lead frame 12. The lead frame 12 is typically constructed from a conductive material such as copper. The lead frame 12 includes a die paddle area 14 that supports an integrated circuit 16. Although an integrated circuit is shown and described, it is to be understood that other electrical devices may be incorporated into the package 10.

The lead frame 12 has a plurality of leads 18 that extend from one side of the die paddle 14. The leads 18 are electrically connected to bond pads 20 of the integrated circuit 16 by bond wires 22.

The lead frame 12 further has a tab 24 that extends from the die paddle area 14. The tab 24 may, or may not be, electrically connected to a bond pad(s) 20 of the integrated circuit 16. In one embodiment the tab 24 may provide an electrical ground plane. The tab 24 may have one or more openings 26 to allow molten plastic material to more readily flow through the lead frame 12.

The integrated circuit 16 and a portion of the lead frame 12 are encapsulated by a housing 28. The housing 28 is typically formed with an injection molded plastic process. The package 10 is constructed so that at least a portion of the leads 18 and the tab 24 extend from the housing 28.

Figure 2:
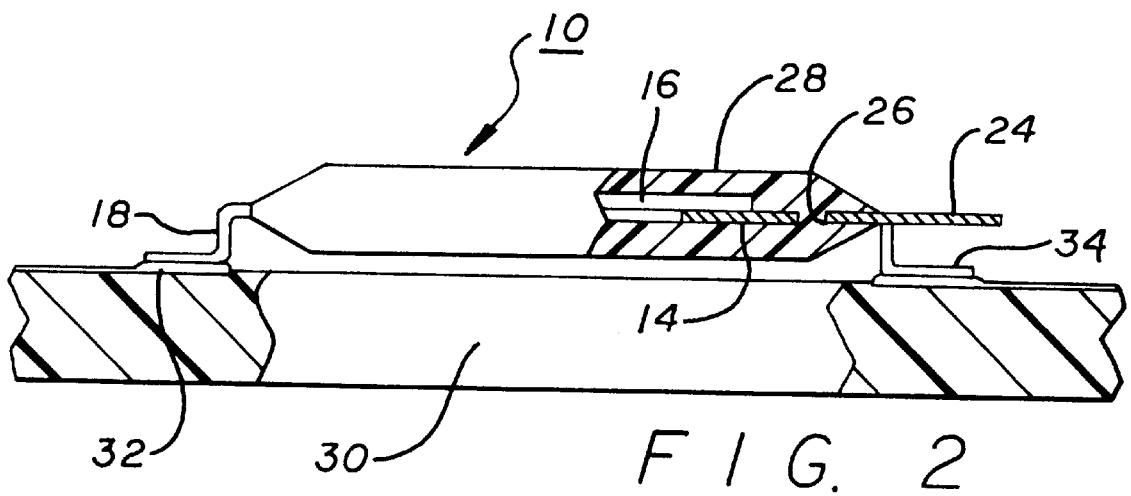
FIG. 2 is a side view showing a package mounted to a printed circuit board.

As shown in FIG. 2, the leads 18 are bent into a configuration that allows the package 10 to be mounted to a printed circuit board 30. The leads 18 are typically soldered to solder pads 32 of the board 30. A pair of feet 34 may also be bent from the tab 24 and attached to the printed circuit board 30. The feet 34 can be stamped from the tab 24 or formed by any other process. The feet 34 can be attached to the printed circuit board 30 by soldering the same to solder pads 32 of the board 30. The feet 34 provide structural support so that the package 10 is not cantilevered from the board 30. Alternatively, the entire tab 24 can be bent and attached to the board 30. FIG. 3 shows an embodiment where the leads 18 are bent in a shape that allows the package 10 to be mounted in a position that is perpendicular to the surface of the board 30.

The tab 24 provides a thermal element that has a lower thermal resistance than a conventional QFP package which has individual leads extending from both sides of the die paddle. A heat sink (not shown) or other additional thermal element can be attached to the tab 24 portion which extends from the package 10. Extending the leads 18 from only one side of the package 10 also minimizes the signal length between the integrated circuit 16 and another package mounted to the board 30. Creating equal distances minimizes the slew between digital signals that are provided on the leads 18 and routed through the board 30.

FIGS. 4 and 5 show a plurality of packages 10 that are mounted to the printed circuit board 30. The packages 10 can be attached to just one side of the circuit board 30, or both sides of the board. A metal clip 36 can be coupled to the tabs 24 of each package 10. The clip 36 may extend around the edge of the printed circuit board 30 to thermally couple the packages 10 on each side of the board 30. The clip 36 provides a heat spreader that can more evenly distribute the heat load of the packages. As shown in FIG. 5, the clip 36 may have a heat sink 38 to increase the surface area and the thermal efficiency of the overall assembly. Although a clip 36 which extends around the edge of the board 30 is shown and described, it is to be understood that the clip 36 may be attached to only one side of the circuit board 30.

Figure 6:
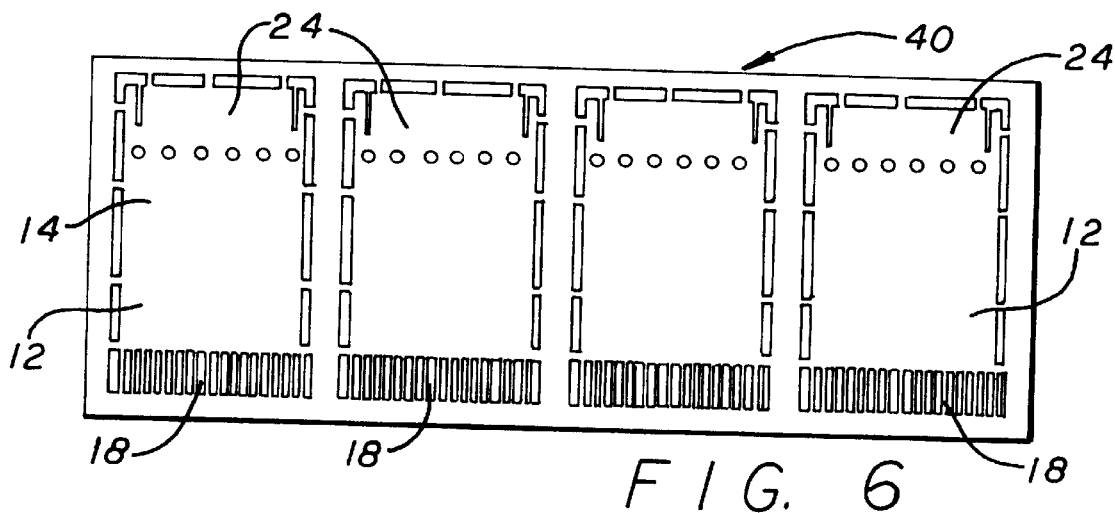
FIG. 6 is a top view of a lead frame reel.
Figure 7:
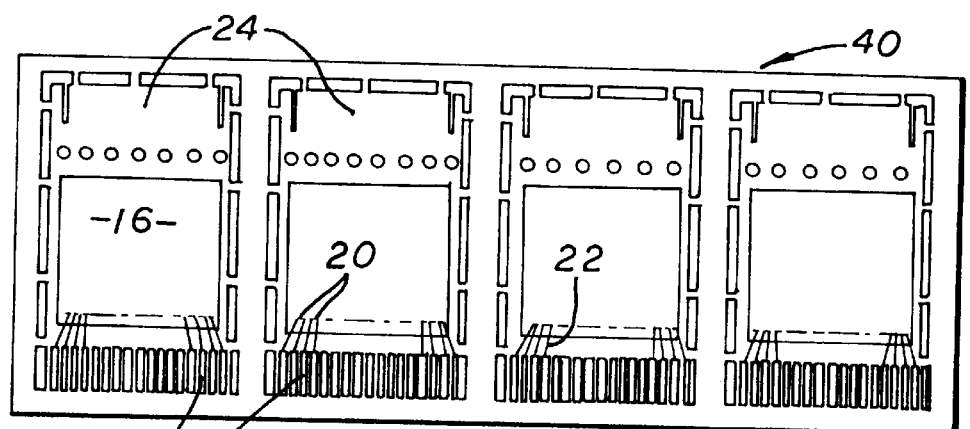
FIG. 7 is a top view showing integrated circuits mounted to the lead frames of the reel.
Figure 8:
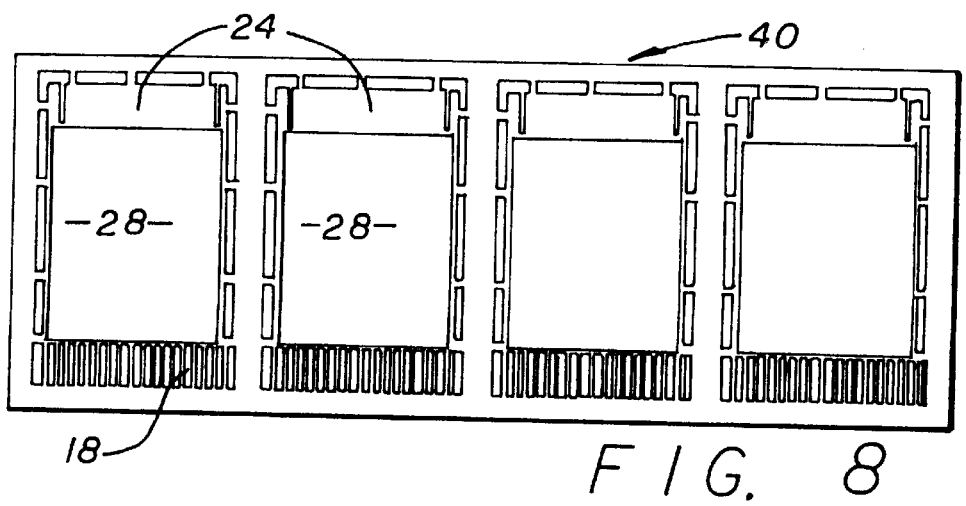
FIG. 8 is a top view showing housings formed about the integrated circuits.

FIG. 6 shows a metal template 40 that contains a plurality of lead frames 12 that are used to construct a number packages 10. The individual leads 18 and tabs 24 are typically etched or stamped from a sheet of copper material. As shown in FIG. 7, integrated circuits 16 are then mounted to the die paddle areas 14 and wire bonded to the leads 18, and possibly the tabs 24. The template 40 is then placed within a mold (not shown). Plastic is injected into the mold to encapsulate the integrated circuits 16 and portions of the lead frames 12 as shown in FIG. 8. The leads 18 and tabs 24 of each lead frame 12 are then cut from the template 40 and bent into an appropriate shape for subsequent mounting to a higher level assembly.

Figure 9A:
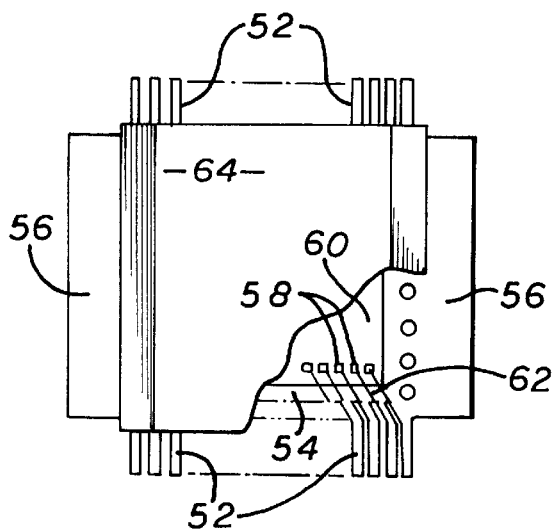
FIG. 9a is a top cross-sectional view showing an alternate embodiment of the package.
Figure 9B:
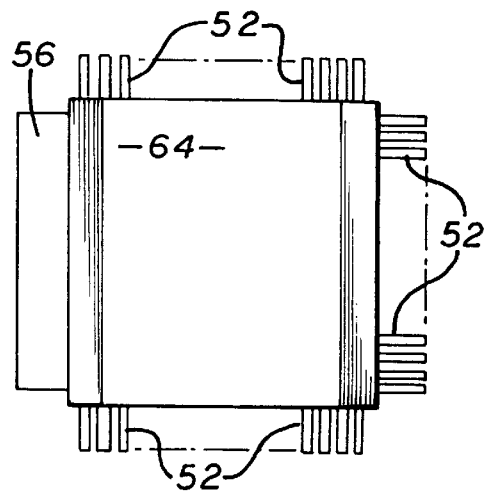
FIG. 9b is a top cross-sectional view showing an alternate embodiment of the package.

FIG. 9 shows an alternate embodiment of a package 50 which has a plurality of leads 52 that extend from opposing sides of a die paddle area 54 and a pair of tabs 56 that extend from opposing sides of the paddle 54. The leads 52, and possibly the tabs 56, may be coupled to the bond pads 58 of an integrated circuit 60 by wire bonds 62. The integrated circuit 60 and a portion of the leads 52 and tabs 56 are encapsulated by a housing 64.

Figure 10:
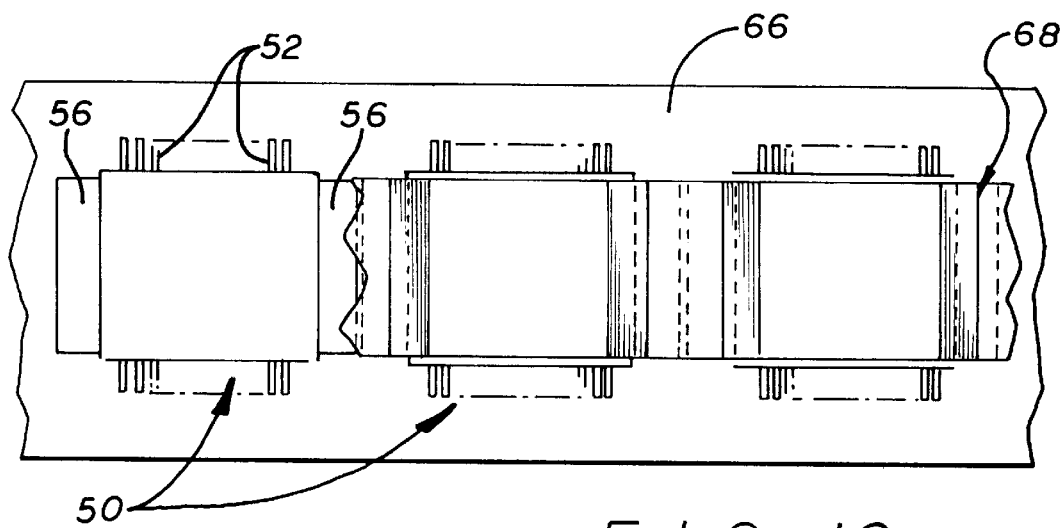
FIG. 10 is a side view of an electrical assembly.
Figure 11:
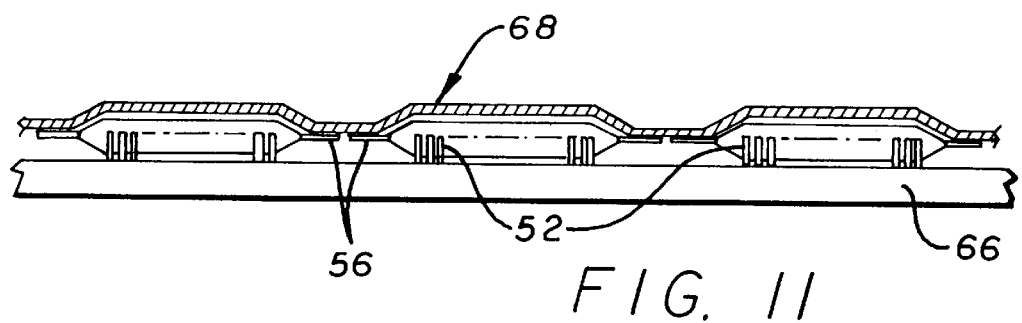
FIG. 11 is a front view of the electrical assembly of FIG. 10.

FIGS. 10 and 11 show an electrical assembly which contains a plurality of packages 50 mounted to a printed circuit board 66. A metal cover 68 can be attached to the circuit board 66 and thermally coupled to the tabs 56 of the packages 50. The metal cover 68 can be bent into a configuration which creates contact between the cover 68 and the tabs 56.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a lead frame which has a die paddle area, a lead extending from a first side of said die paddle area and a tab that extends from a second side of said die paddle area;

an integrated circuit that is mounted to said die paddle area and coupled to said lead; and, a housing that surrounds said integrated circuit.

2. The package as recited in claim 1, wherein said lead extends from said housing and is bent at a right angle.

3. The package as recited in claim 1, wherein said lead extends from said housing and is bent into an S-shape.

4. The package as recited in claim 1, wherein said lead frame has two sets of leads extending from opposite sides of said die paddle, and two tabs that each extend from an opposite side of said die paddle.

5. The package as recited in claim 1, wherein said tab has an opening.

6. The package as recited in claim 1, wherein said tab has a pair of feet.

* * * * *